United States Patent
Nicolls et al.

(10) Patent No.: US 7,242,291 B2
(45) Date of Patent: Jul. 10, 2007

(54) ARC FAULT CIRCUIT INTERRUPTER TEST CIRCUIT AND TEST BOARD

(75) Inventors: Christopher A. Nicolls, Rehoboth, MA (US); Roger D. Mayer, Rehoboth, MA (US)

(73) Assignee: Sensata Technologies, Inc., Attleboro, MA (US)

( * ) Notice: Subject to any disclaimer, the term of this patent is extended or adjusted under 35 U.S.C. 154(b) by 248 days.

(21) Appl. No.: 11/147,846

(22) Filed: Jun. 8, 2005

(65) Prior Publication Data

US 2007/0008103 A1  Jan. 11, 2007

(51) Int. Cl.
*G08B 29/00*  (2006.01)
*H02H 3/00*  (2006.01)
*G01R 31/08*  (2006.01)

(52) U.S. Cl. .................. 340/515; 340/515; 340/659; 340/3.43; 324/500; 324/536; 324/763; 361/42; 361/78

(58) Field of Classification Search ............... 340/515, 340/659; 324/536; 361/42
See application file for complete search history.

(56) References Cited

U.S. PATENT DOCUMENTS

| | | | |
|---|---|---|---|
| 6,313,642 B1 * | 11/2001 | Brooks | ................ 324/547 |
| 6,876,204 B2 * | 4/2005 | Smith | ................ 324/536 |
| 2002/0149891 A1 | 10/2002 | Neiger et al. | |
| 2003/0160619 A1 * | 8/2003 | Parker | ................ 324/536 |
| 2004/0109269 A1 * | 6/2004 | Kawate et al. | ................ 361/42 |

OTHER PUBLICATIONS

U.S. Appl. No. 10/937,487, filed Sep. 9, 2004 entitled Method for Detecting Arc Faults.
U.S. Appl. No. 10/314,715, filed Dec. 9, 2002 entitled Arc Detection Apparatus and Method.

\* cited by examiner

*Primary Examiner*—Donnie L. Crosland
(74) *Attorney, Agent, or Firm*—Russell E. Baumann

(57) ABSTRACT

A tester for an arc fault circuit interrupter that can selectively simulate and apply electrical arc faults and nuisance loads to at least one device under test (DUT). The tester includes a power supply, a test controller, and test circuitry coupleable to a DUT. AC power input is provided to the DUT and the power supply, which regulates the AC power input to a DC level for powering the test controller. The test circuitry full wave rectifies AC current returning from the DUT, and the test controller controls a switch in the test circuitry. When the switch is on, the AC current flows through the DUT, the full wave rectifier, the load, and the switch to ground. To simulate an arcing condition, the test controller turns the switch on and off at random intervals. To simulate a nuisance load condition, the test controller turns the switch on and off at periodic intervals. In this way, proper operation of the DUT can be verified under both arcing and nuisance load conditions.

20 Claims, 8 Drawing Sheets

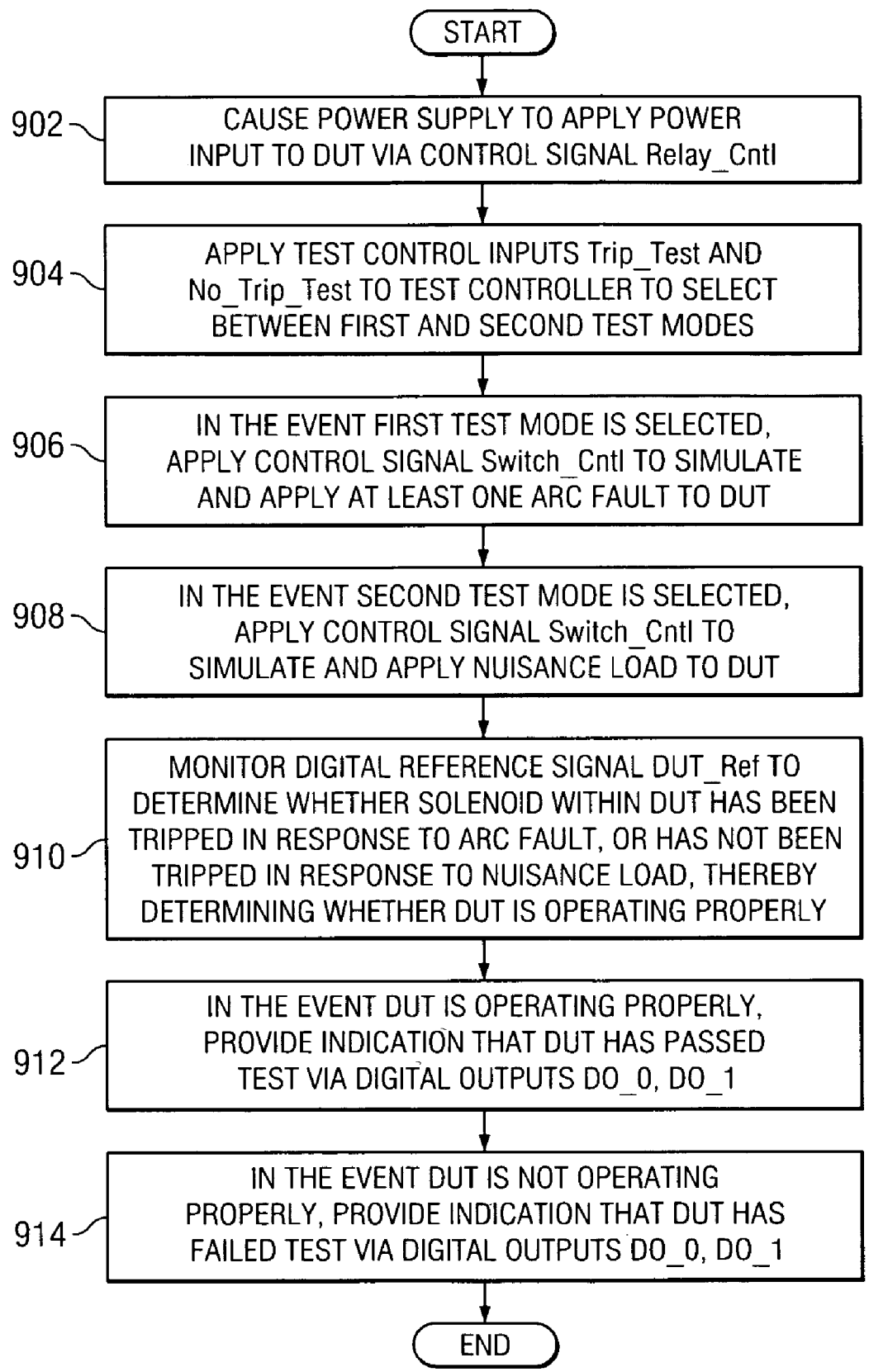

ARC FAULT CIRCUIT INTERRUPTER TEST CIRCUIT AND TEST BOARD

CROSS REFERENCE TO RELATED APPLICATIONS

N/A

STATEMENT REGARDING FEDERALLY SPONSORED RESEARCH OR DEVELOPMENT

N/A

BACKGROUND OF THE INVENTION

The present invention relates generally to the testing of electrical and electronic circuits and devices, and more specifically to the testing of arc fault circuit interrupters.

U.S. patent application Ser. No. 10/937,487 filed Sep. 9, 2004 entitled APPARATUS AND METHOD FOR DETECTING ARC FAULTS (the '487 application) discloses an arc fault circuit interrupter (AFCI) device that can reliably detect and distinguish between electrical arc faults and nuisance loads, and trip a circuit breaker to disconnect power to a load in the event electrical arcing has occurred. Electrical arc faults are generally non-periodic arcing events that may be caused by corroded, worn, aged, or otherwise damaged wiring or wire insulation, and/or faulty electrical connections. For example, electrical arcing can occur between the ends of a two wire conductor, between a conductor and ground, or between respective conductors connected to a load. In contrast, nuisance loads are generally associated with periodic electrical events that may be caused by triac-controlled dimmer circuits, switch-mode power supplies, appliance thermostat switching, drill current transitions, random line voltage spikes, or EMI bursts. Whereas electrical arcing often has the capability of igniting adjacent flammable material and therefore generally constitutes a fire hazard, nuisance loads are typically incapable of creating such a hazardous condition. Because the arc fault circuit interrupter disclosed in the '487 application can distinguish between electrical arc faults and nuisance loads with a high degree of reliability, the AFCI device can successfully disconnect power to a load upon detection of electrical arcing while being significantly less susceptible to nuisance tripping.

To assure that the AFCI device disclosed in the '487 application is operating properly during manufacture and test and in the field, a tester may be employed to apply simulated electrical arcing to the device, and to determine whether the device performs an expected tripping operation in response to the simulated arc fault. However, testing such an AFCI device can be problematic because not only must the device be tested to verify tripping in response to electrical arcing, but it must also be tested to verify that no tripping occurs when the device is connected to a nuisance load.

Heretofore, the requirement of AFCI device testers to simulate both electrical arcing and nuisance loads has not been fully met. It would be desirable to have a tester for an arc fault circuit interrupter that addresses this requirement.

BRIEF SUMMARY OF THE INVENTION

In accordance with the present invention, a tester for an arc fault circuit interrupter (AFCI) device is provided that can selectively simulate and apply electrical arc faults and nuisance loads to at least one device under test (DUT), and determine whether or not the DUT performs a tripping operation in response to the applied arc fault or nuisance load, thereby verifying proper device operation under both electrical arcing and nuisance load conditions. In one embodiment, the tester includes a power supply, a test controller, and test circuitry coupleable to a DUT. In one mode of operation, AC power input is provided to the power supply, which regulates the AC power input to an appropriate DC level for powering the test controller. The AC power input is also provided to the DUT via the power supply. Next, the test circuitry receives and full wave rectifies AC current returning from the DUT. The test circuitry includes a resistive load and an electronically controlled switch coupled in series between the full wave rectifier and ground. The test controller controls the activation/deactivation of the switch included in the test circuitry. When the switch is activated ("turned on"), current flows from the power supply, through the DUT, through the full wave rectifier, through the load, and finally through the switch to ground. When the switch is deactivated ("turned off"), no current flows from the power supply through the DUT. The power supply is configured to assure that the switch control circuitry is biased at the same ground potential as the load. To simulate an electrical arcing condition, the test controller turns the switch on momentarily at substantially random intervals of time. Such substantially random switching typically appears as electrical arcing to the DUT. To simulate a nuisance load condition, the test controller turns the switch on momentarily at substantially periodic intervals of time, thereby generating periodic noise such as might be produced by a triac-controlled dimmer circuit, a switch-mode power supply, appliance thermostat switching, drill current transitions, random line voltage spikes, or EMI bursts. In the preferred embodiment, the test controller monitors the AC power line to determine appropriate points in the line voltage waveform at which to turn the switch on. By providing a test controller that can selectively simulate and apply electrical arc faults and nuisance loads to at least one AFCI device under test, proper operation of the device can be verified under both electrical arcing and nuisance load conditions.

Other features, functions, and aspects of the invention will be evident from the Detailed Description of the Invention that follows.

BRIEF DESCRIPTION OF THE SEVERAL VIEWS OF THE DRAWINGS

FIG. 9 is a flow diagram of a method of operating the tester of FIG. 1; and

DETAILED DESCRIPTION OF THE INVENTION

The disclosure of U.S. patent application Ser. No. 10/937,487 filed Sep. 9, 2004 entitled APPARATUS AND METHOD FOR DETECTING ARC FAULTS (the '487 application) is incorporated herein by reference.

A tester for an arc fault circuit interrupter (AFCI) device is disclosed that can simulate and apply electrical arc faults and nuisance loads to at least one device under test (DUT), and determine whether or not the DUT performs a tripping operation in response to the applied arc fault or nuisance load, thereby verifying proper device operation under both electrical arcing and nuisance load conditions.

Figure 1:
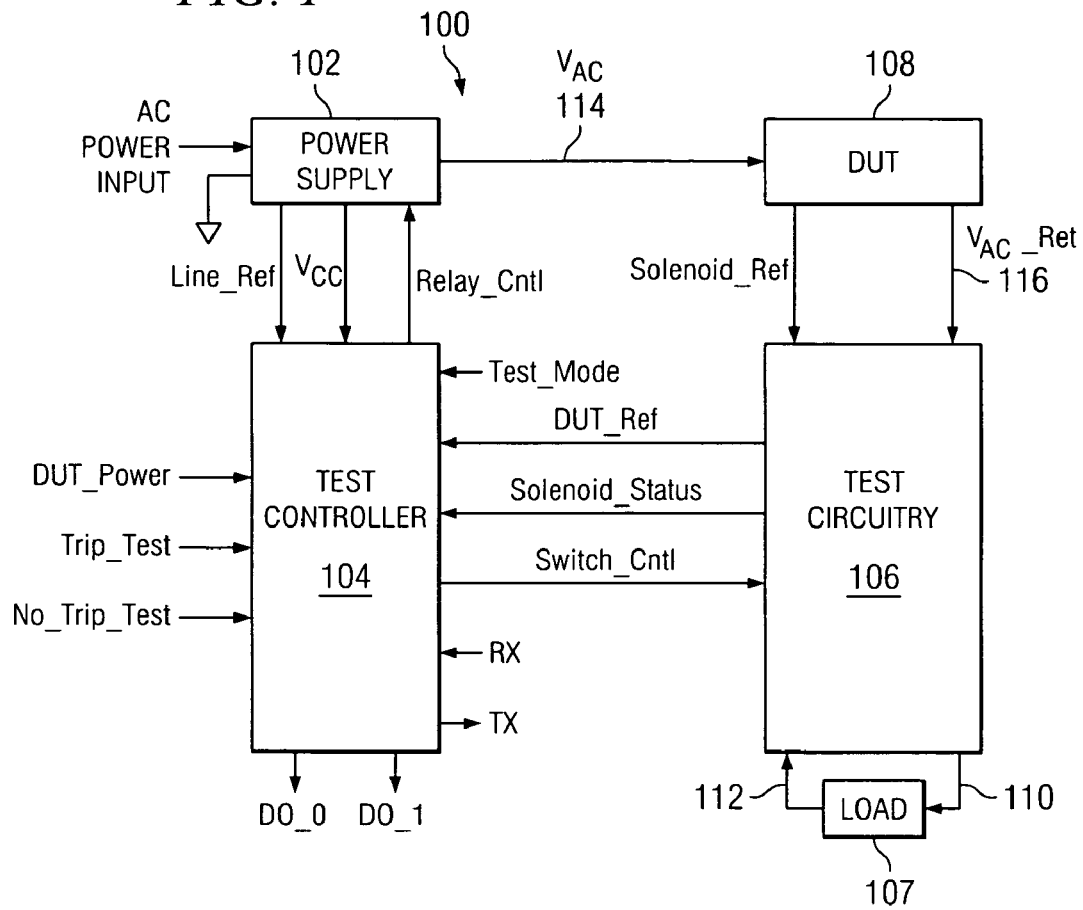
FIG. 1 is a block diagram of a tester for an arc fault circuit interrupter device according to the present invention.

FIG. 1 depicts an illustrative embodiment of an AFCI device tester 100, in accordance with the present invention. In the illustrated embodiment, the tester 100 includes a power supply 102, a test controller 104, and test circuitry 106, which is coupleable to a device under test (DUT) 108. In the presently disclosed embodiment, the DUT 108 corresponds to an arc fault circuit interrupter device, as disclosed in the above-referenced '487 application. It should be understood, however, that the tester 100 may be employed to verify the operation of any suitable AFCI device. In a typical mode of operation, a single phase AC power input $V_{AC}$ is provided to the power supply 102, which regulates the power input $V_{AC}$ to an appropriate DC level $V_{CC}$ for powering the test controller 104. The AC power input $V_{AC}$ is also provided to the DUT 108 via the power supply 102 on a line 114. The test controller 104 provides a control signal Relay_Cntl to the power supply 102 based on the logical level of a test control input signal DUT_Power applied thereto, thereby providing relay-controlled AC power input $V_{AC}$ to the DUT 108. The power supply 102 provides a reference voltage Line_Ref proportional to the regulated power input $V_{AC}$ to the test controller 104.

As described in the above-referenced '487 application, the AFCI device 108 is operative to monitor the AC power input $V_{AC}$ on the line 114, to detect electrical arcing or nuisance load events (e.g., current/voltage spikes) occurring in the power input $V_{AC}$, and to employ one or more algorithms such as a three cycle algorithm (TCA) to determine whether the detected events resulted from an arc fault or a nuisance load. If the electrical events resulted from an arc fault, then the AFCI device trips an electromechanical interface such as a solenoid to disconnect the power input $V_{AC}$ from the device. If the electrical events resulted from a nuisance load, then the AFCI device refrains from tripping the solenoid within the device.

In the presently disclosed embodiment, the tester 100 is operative in a final device assembly test mode and a board test mode. It is noted that when operating in the board test mode, the DUT 108 is typically not populated with electro-mechanical components such as the solenoid. Accordingly, in the board test mode, the DUT 108 provides a reference signal Solenoid_Ref to the test circuitry 106 to indicate whether or not an attempt has been made to trip the solenoid normally included within the DUT 108. For example, the reference signal Solenoid_Ref can be accessed across the solenoid test points of the DUT 108, which are depicted in the above-referenced '487 application. The test circuitry 106 provides a status signal Solenoid_Status to the test controller 104 based on the level of the reference signal Solenoid_Ref to indicate to the test controller 104 whether or not an attempt has been made to trip the solenoid.

When operating in the final device assembly test mode, the DUT 108 provides AC power return $V_{AC}$_Ret to the test circuitry 106 via a line 116. The test circuitry 106 applies the power return $V_{AC}$_Ret to a full wave rectifier incorporated therein, and provides a digital reference signal DUT_Ref proportional to the rectified power return $V_{AC}$_Ret to the test controller 104. As herein described, the test circuitry 106 includes an electronically controlled switch, which is coupled in series to a resistive load 107 between the full wave rectifier and ground. In one embodiment, the load 107 is selected to allow a current of about 5 amps at 120 $V_{AC}$. The test controller 104 controls the activation/deactivation of the electronic switch by applying suitable control pulses to the switch via a control signal Switch_Cntl. When the switch is activated ("turned on"), current flows from the power supply 102, through the DUT 108, through the full wave rectifier, through the load 107, and finally through the switch to ground. When the switch is deactivated ("turned off"), no current flows from the power supply 102 through the DUT 108.

In the presently disclosed embodiment, the test controller 104 turns the switch on and off via the control signal Switch_Cntl based on the logical levels of test control input signals Trip_Test and No_Trip_Test applied thereto. In one embodiment, in the event the logical levels of the test control inputs Trip_Test and No_Trip_Test are high and low, respectively, the test controller 104 turns the switch on momentarily at substantially random intervals of time to simulate and apply one or more arc faults to the DUT 108. In the event the logical levels of Trip_Test and No_Trip_Test are low and high, respectively, the test controller 104 turns the switch on momentarily at substantially periodic intervals of time to simulate and apply a nuisance load to the DUT 108. In the preferred embodiment, the test controller 104 monitors the reference voltage Line_Ref to identify appropriate points in the line voltage waveform at which to turn the electronic switch on. Accordingly, in the final device assembly test mode, the test circuitry 106 provides the digital signal DUT_Ref to the test controller 104 to indicate whether or not the solenoid has been tripped. For example, the test controller 104 can determine whether or not the solenoid has been tripped by monitoring the level of the digital signal DUT_Ref. Finally, the test controller 104 provides an indication of the test status via digital output signals DO_0, DO_1, which may be employed to drive respective LEDs.

By applying appropriate levels to the test control inputs Trip_Test and No_Trip_Test, the tester 100 can be made to simulate and apply either arc faults or nuisance loads to the DUT 108. Further, a human operator can visually verify proper operation of the DUT 108 by monitoring the LEDs driven by the digital outputs DO_0, DO_1. In the final device assembly test mode, the test controller 104 provides the digital outputs DO_0, DO_1 to indicate whether or not the solenoid within the DUT 108 has been tripped in response to the applied arc fault or nuisance load. In the board test mode, the digital outputs DO_0, DO_1 are provided to indicate whether or not an attempt has been made to trip the solenoid normally included within the DUT 108. In this way, proper operation of the DUT 108 can be easily verified under both electrical arcing and nuisance load conditions.

Figure 2A:
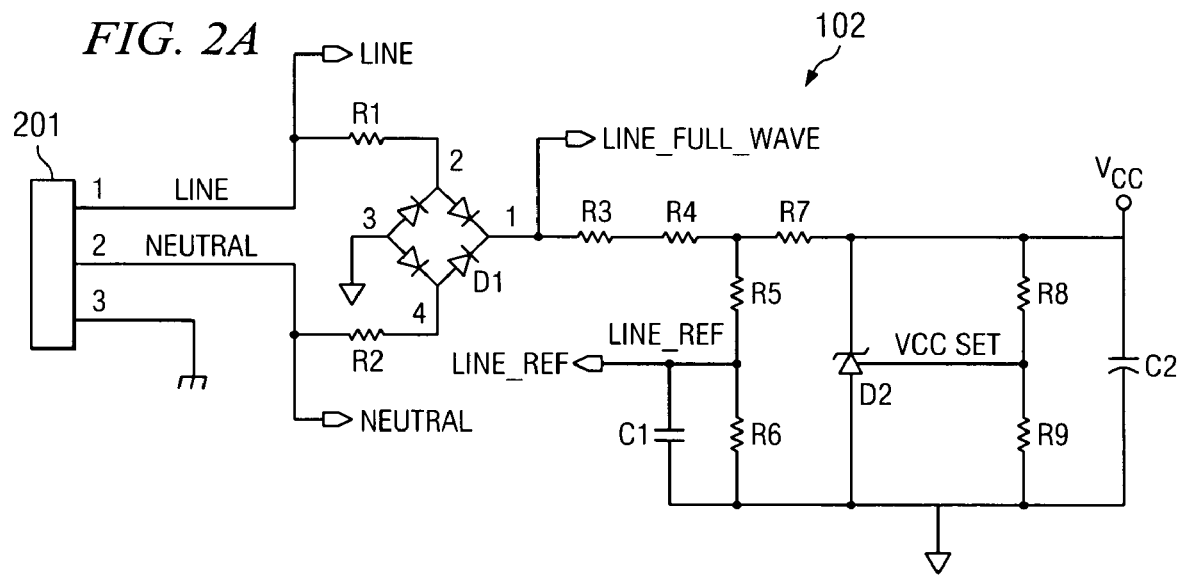
FIGS. 2a-2b are schematic diagrams of power supply circuitry included in the tester of FIG. 1.
Figure 2B:
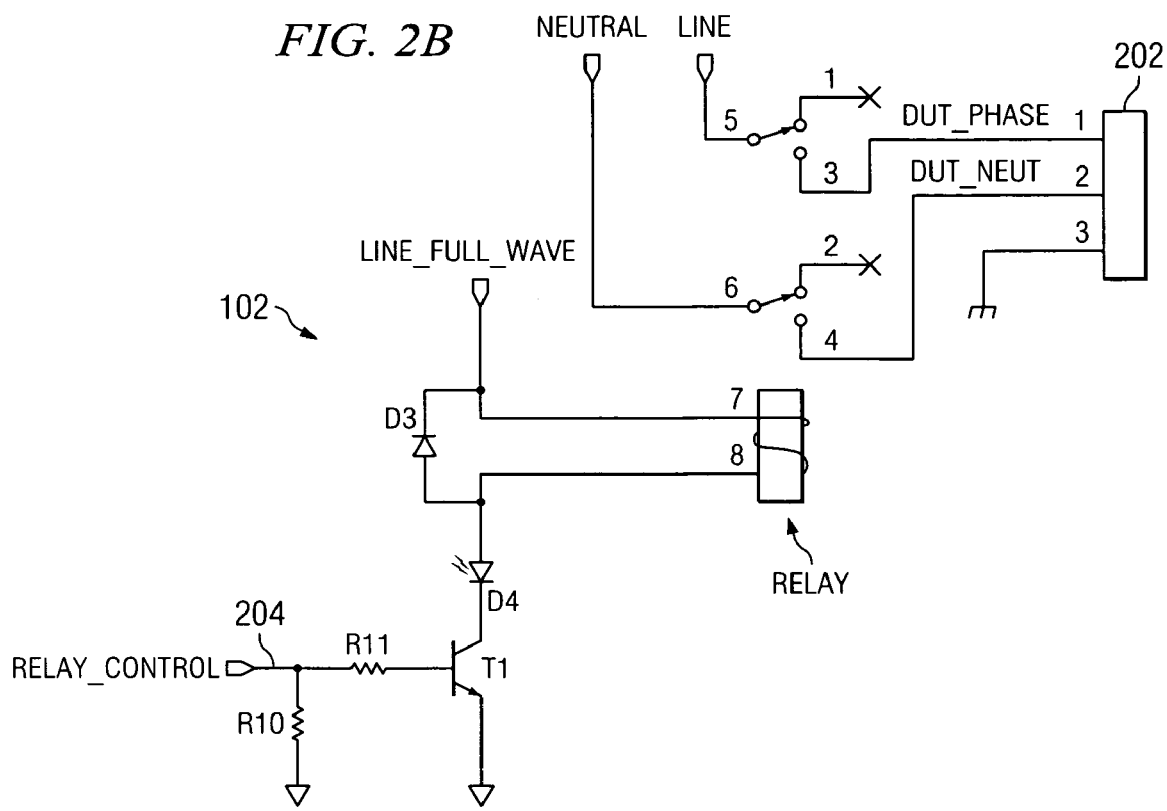

FIGS. 2a-2b depict circuitry included in the power supply 102 (see FIG. 1). As shown in FIG. 2a, the power supply circuitry 102 receives the AC power input $V_{AC}$ at a header 201 connected to an AC power line having hot and neutral conductors, which are coupled to a full wave bridge rectifier D1 via resistors R1-R2. The bridge rectifier D1 is operative to full wave rectify the power input $V_{AC}$, and to regulate the rectified power input to the DC level $V_{CC}$ for powering the test controller 104 (see FIG. 1). FIG. 2a also depicts the reference voltage Line_Ref, which is provided to the test controller 104 (see also FIG. 1). The remainder of the power supply circuitry 102 of FIG. 2a includes resistors R3-R9, capacitors C1-C2, and a zener diode D2.

As described above, the test controller 104 provides the control signal Relay_Cntl to the power supply 102 for providing relay-controlled AC power input $V_{AC}$ to the DUT 108. As shown in FIG. 2b, the control signal Relay_Cntl is applied to a node 204. Further, a resistor R10 is coupled between the node 204 and ground, and a resistor R11 is coupled between the node 204 and the base of a transistor T1. In one embodiment, in the event the logical level of the control input DUT_Power is high, the level of the Relay_Cntl signal goes high, and the resistors R10-R11 assure that a suitable voltage level is applied to the base of the transistor T1 to turn the transistor on. In the event the logical level of the control input DUT_Power is low, the level of the Relay_Cntl signal goes low to turn the transistor T1 off. Moreover, an LED D4 is connected between a first terminal of a Relay and the collector of the transistor T1, and a second terminal of the Relay is connected to a line carrying the rectified power input $V_{AC}$.

Accordingly, when the transistor T1 is turned on, the Relay is also turned on, thereby causing the hot and neutral conductors to be connected to a header 202. The AC power input $V_{AC}$ is provided to the DUT 108 via the header 202, which has the hot and neutral conductors connected thereto. It is noted that when the transistor T1 is turned on, current flows through the LED D4 to provide a visual indication to the operator of the AC power input being applied to the DUT 108. When the transistor T1 is turned off, the Relay is also turned off to disconnect the hot and neutral conductors from the header 202. By applying suitable voltage levels to the base of the transistor T1 via the control signal Relay_Cntl, the test controller 104 can be employed to toggle the Relay on and off. The remainder of the power supply circuitry 102 of FIG. 2b includes a diode D3 connected across the first and second terminals of the Relay.

Figure 3A:
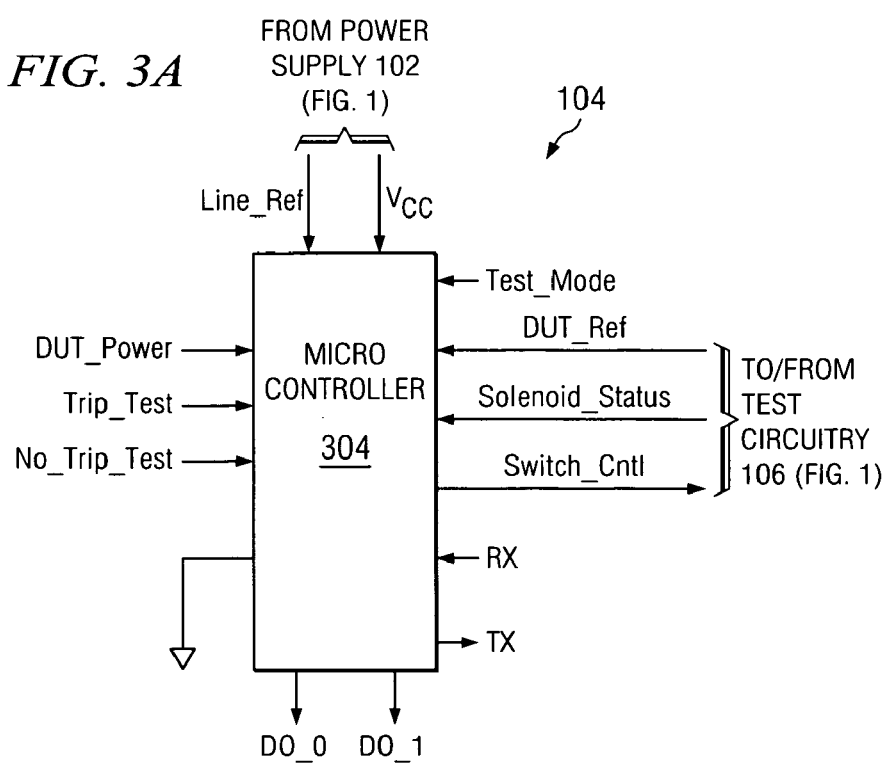
FIGS. 3a-3c are schematic diagrams of test controller circuitry included in the tester of FIG. 1.
Figure 3B:
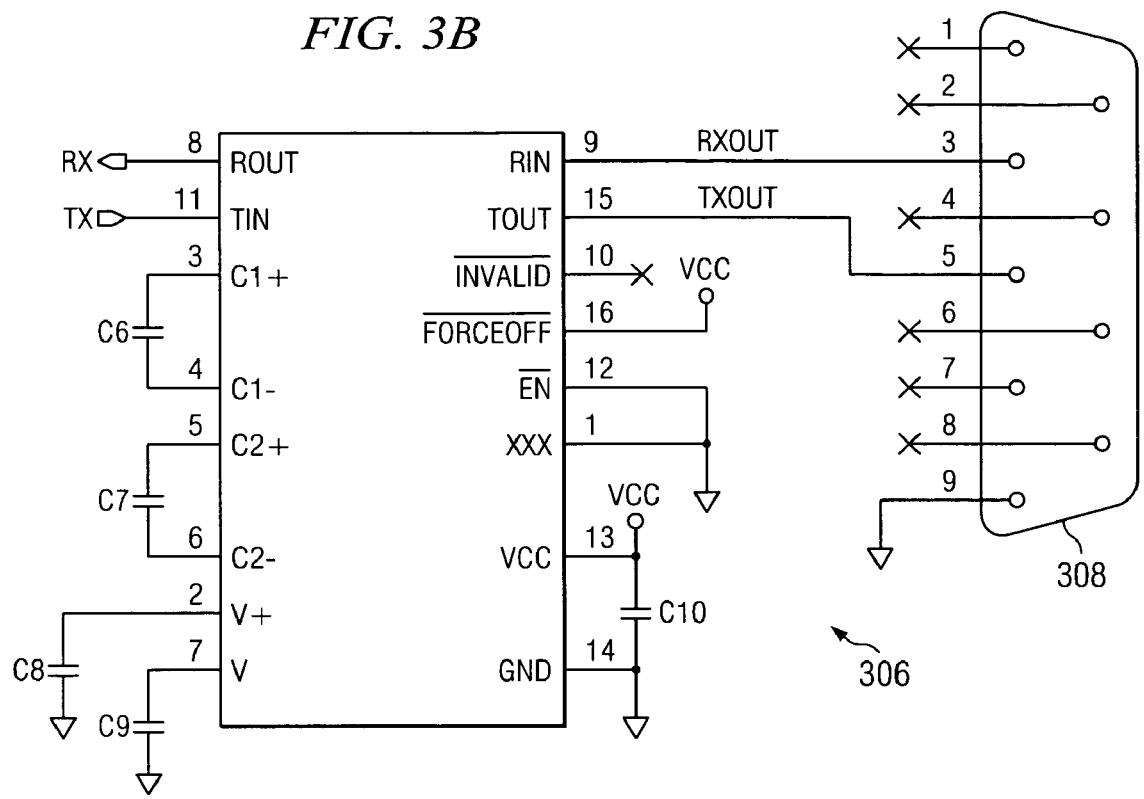
Figure 3C:
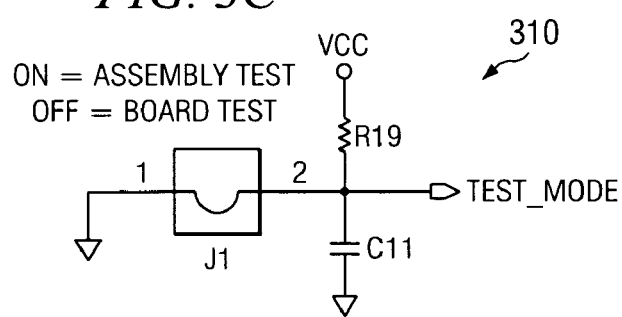
Figure 4:
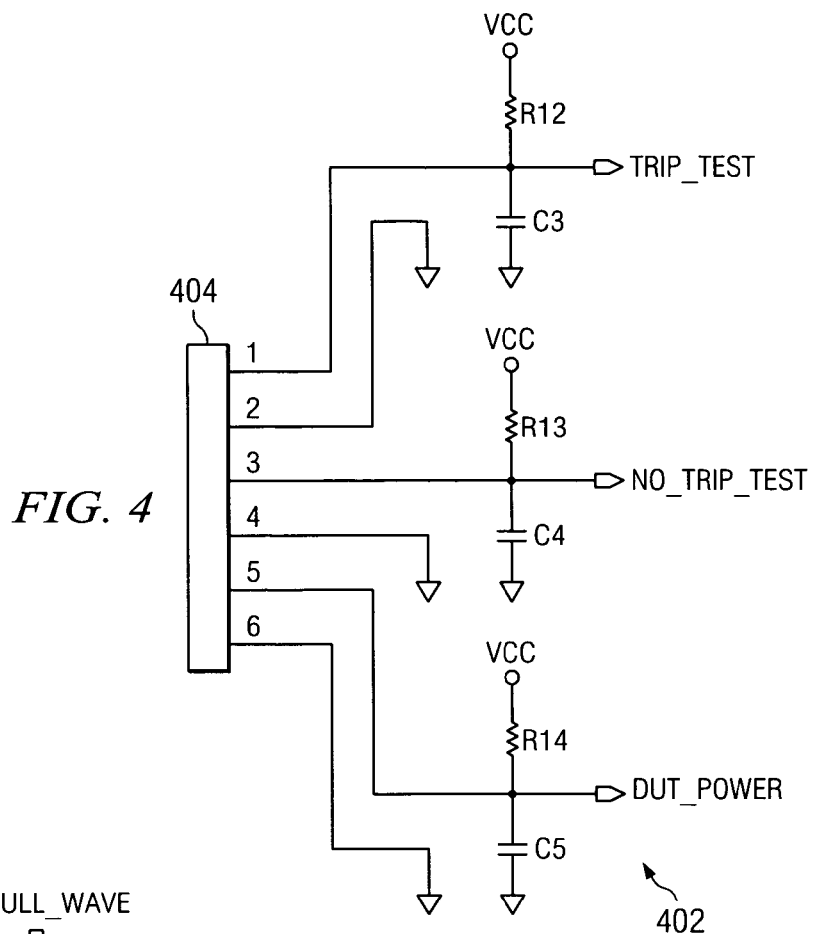
FIG. 4 is a schematic diagram of test control input circuitry included in the tester of FIG. 1.

FIGS. 3a-3c depict circuitry included in the test controller 104 (see FIG. 1). As shown in FIG. 3a, the test controller circuitry 104 includes an embedded micro-controller 304, which receives the test control inputs DUT_Power, Trip_Test, and No_Trip_Test as digital inputs. In the preferred embodiment, the tester 100 includes an operator interface including a plurality of dry-contact inputs for providing the test control inputs DUT_Power, Trip_Test, and No_Trip_Test to the micro-controller 304. FIG. 4 depicts an operator interface 402 including a header 404, resistors R12-R14, and capacitors C3-C5. It is understood that any suitable switches and/or relays (not shown) can be employed to provide appropriate levels to the test control inputs DUT_Power, Trip_Test, and No_Trip_Test via the header 404 to cause a desired test to be performed.

In addition, the micro-controller 304 receives both the reference voltage Line_Ref as an analog input, and the DC power input $V_{CC}$ from the power supply 102. The micro-controller 304 also receives the digital reference signal DUT_Ref and the status signal Solenoid_Status as analog inputs from the test circuitry 106. The micro-controller 304 provides the control signal Switch_Cntl to the test circuitry 106 for controlling the activation/deactivation of the switch incorporated therein. The micro-controller 304 provides indications of the test status via the digital outputs DO_0, DO_1. In the preferred embodiment, the digital outputs DO_0, DO_1 are employed to drive respective LEDs (not shown). It is understood, however, that the digital outputs DO_0, DO_1 may alternatively be employed to drive respective lamps, relays, or any other suitable device for indicating the test status to the operator.

Figure 5:
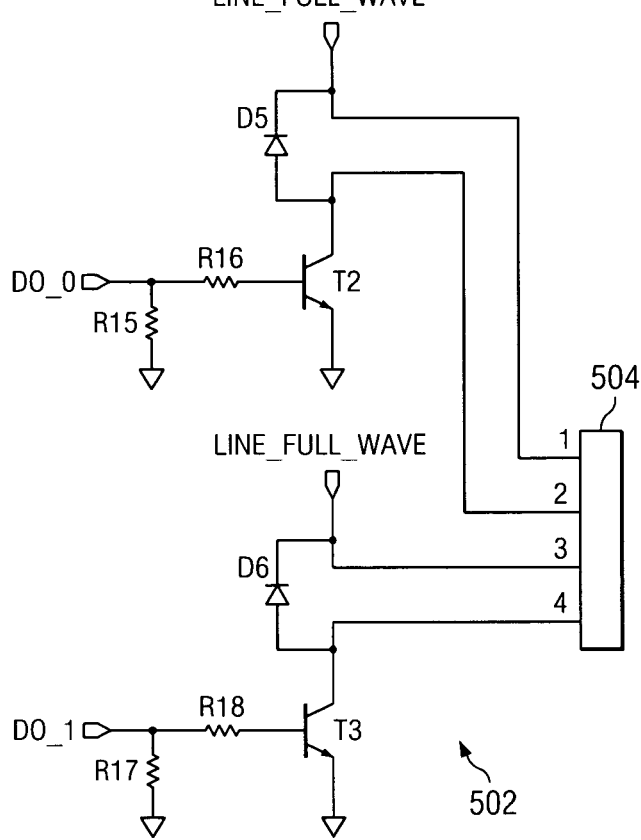
FIG. 5 is a schematic diagram of test status output circuitry included in the tester of FIG. 1.

FIG. 5 depicts circuitry 502 for driving the respective LEDs via the digital outputs DO_0-DO_1. As shown in FIG. 5, the drive circuitry 502 includes resistors R15-R18, transistors T2-T3, and diodes D5-D6. By applying suitable voltage levels to the bases of the transistors T2-T3 via the digital outputs DO_0 and DO_1, respectively, the micro-controller 304 can be employed to selectively turn the transistors T2-T3 on and off, thereby causing current to flow from the line carrying the rectified power input $V_{AC}$, through the respective LEDs (not shown) connected to a header 504, and through the transistors T2-T3 to ground. In this way, a visual indication of the test status can be provided to the operator.

In the presently disclosed embodiment, the tester 100 includes a serial interface to a computer. In the preferred embodiment, the serial interface is an RS232 interface. FIG. 3b depicts an RS232 serial interface 306 included in the test controller 102 (see FIG. 1). As shown in FIG. 3b, the RS232 interface 306 receives serial transmit data Tx from the micro-controller 304 (see also FIG. 3a), and provides serial receive data Rx to the micro-controller 304 (see also FIG. 3a). In addition, the RS232 interface 306 receives serial receive data RxOUT via a connector 308, and provides serial transmit data TxOUT to the connector 308, which is connectable via a cable to a personal computer (PC) or any other suitable type of computer (not shown). In one embodiment, the micro-controller 304 is programmable to allow the operator to control the tester 100 via a PC communicably coupled to the RS232 interface 306 via the connector 308. The RS232 interface 306, which also includes capacitors C6-C10, is powered by the DC power input $V_{CC}$ provided by the power supply 102 (see also FIG. 1).

The test controller 104 further includes circuitry 310 for providing a test mode selection, as depicted in FIG. 3c. The test mode selection circuitry 310 includes a jumper J1, a resistor R19, and a capacitor C11. In the presently disclosed embodiment, the test mode selection circuitry 310 is employed to select between a final device assembly test mode and a board test mode. In one embodiment, in the event the jumper J1 connects a Test_Mode control input of the micro-controller 304 (see also FIGS. 1 and 3a) to ground, the board test mode is selected. In the event the jumper J1 connection is open, allowing the Test_Mode control input to be pulled up to $V_{CC}$ via the resistor R19, the assembly test mode is selected. The assembly and board test modes of the tester 100 are described below.

Figure 6A:
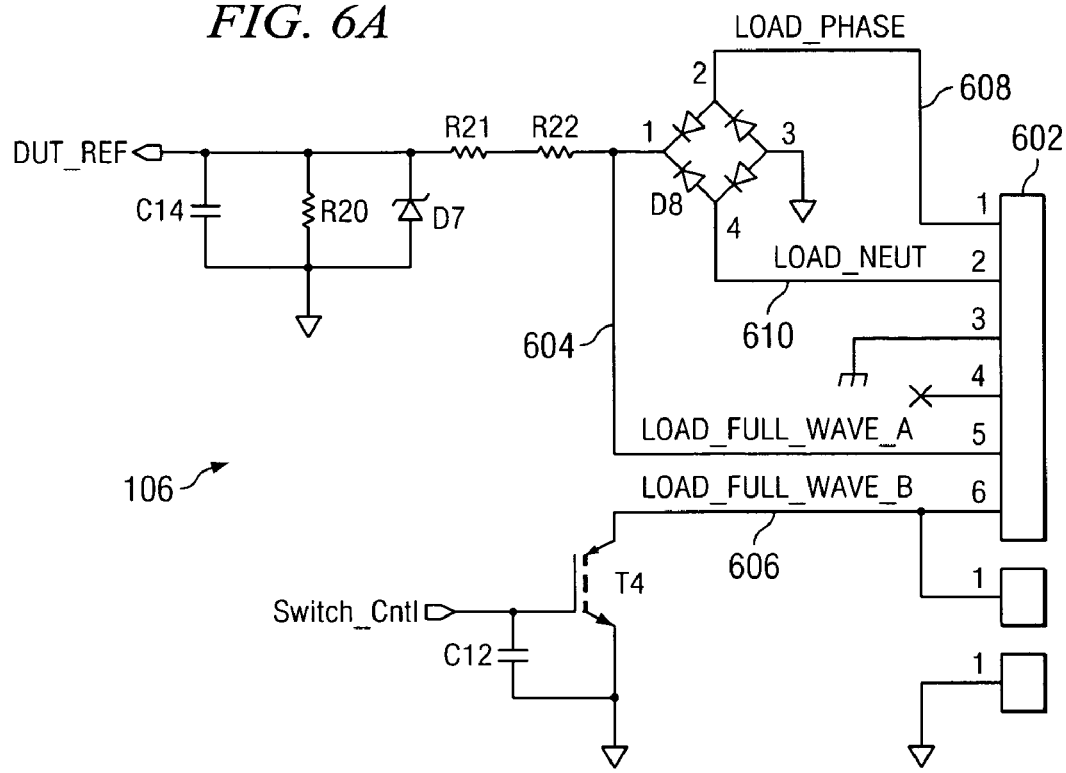
FIGS. 6a-6b are schematic diagrams of test circuitry included in the tester of FIG. 1.
Figure 6B:
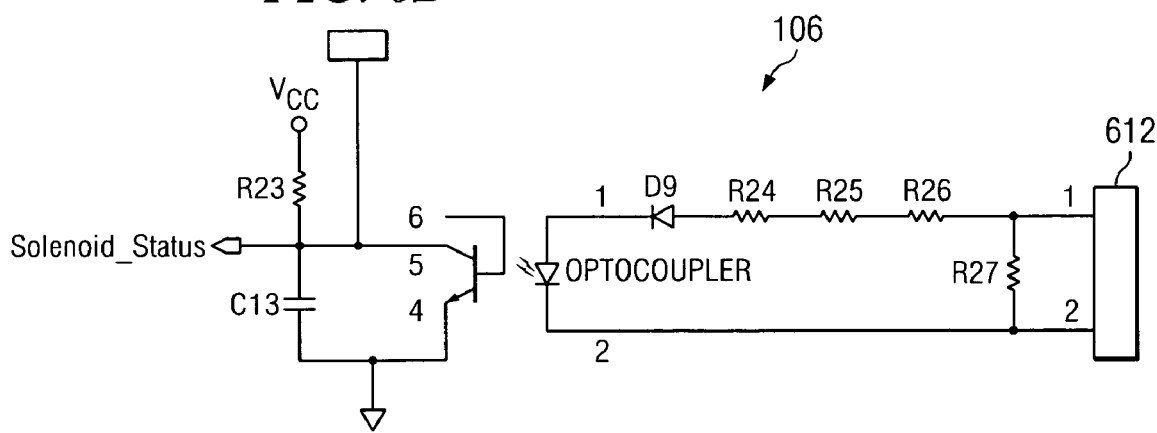

FIGS. 6a-6b depict circuitry included in the test circuitry 106 (see FIG. 1). Specifically, the circuitry of FIG. 6a is employed when the tester 100 is operating in the final device assembly test mode, and the circuitry of FIG. 6b is employed when the tester 100 is operating in the board test mode. As described above, in the final device assembly test mode, the DUT 108 provides the power return $V_{AC}$_Ret to the test circuitry 106 (see also FIG. 1). In the illustrated embodiment, the power return $V_{AC}$_Ret is provided to the test circuitry 106 via a load line phase (Load_Phase) terminal and a load neutral (Load_Neut) terminal included in a header 602 (see FIG. 6a). The test circuitry 106 applies the power return $V_{AC}$_Ret to a full wave bridge rectifier D8 via the Load_Phase and Load_Neut terminals and lines 608 and 610, respectively. Next, the test circuitry 106 provides the rectified power return $V_{AC}$_Ret (Load_Full_Wave_A) via a line 604 to the header 602, which is connected to the load 107 via a line 110 (see FIG. 1). The load 107 then provides a power return Load_Full_Wave_B to the header 602 via a line 112 (see FIG. 1). Finally, the power return Load_Full_Wave_B is provided to an electronic switch T4 via a line 606 connected between the header 602 and the switch T4. In the preferred embodiment, the electronic switch T4 comprises an insulated gate bipolar transistor (IGBT). It should be understood, however, that the switch T4 may alternatively comprise any other suitable type of solid state switch.

As shown in FIG. 6a, the digital reference signal DUT_Ref, which is proportional to the power return Load_Full_Wave_A, is provided by resistors R21-R22, a capacitor C14, a resistor R20, and a zener diode D7. Specifically, when the voltage provided by the bridge rectifier D8 multiplied by the resistive divider formed by the resistors R20-R22 exceeds the zener voltage of the diode D7, the level of the digital reference signal DUT_Ref is digital high. In effect, the circuitry of FIG. 6a operates to indicate whether or not a voltage is present at the load terminals of the DUT 108.

As further described above, the test controller 104 turns the switch T4 on and off via the control signal Switch_Ctnl. When the switch T4 is turned on, current flows from the power supply 102 to the DUT 108 via the line 114, from the DUT 108 to the header 602 within the test circuitry 106 via the line 116, from the header 602 to the full wave bridge rectifier D8 via the lines 608 and 610, from the bridge rectifier D8 to the load 107 via the lines 604 and 110, from the load 107 to the switch T4 via the lines 112 and 606, and finally through the switch T4 to ground (see FIGS. 1 and 6a). When the switch T4 is turned off, no current flows from the power supply 102 through the DUT 108. It is noted that full wave rectification of the power return $V_{AC}$_Ret is provided to assure that the circuitry controlling the operation of the electronic switch T4 is biased at the same ground potential as the load 107. The remainder of the test circuitry 106 of FIG. 6a includes a capacitor C12.

The test circuitry 106 also includes circuitry operative to provide the status signal Solenoid_Status to the test controller 104, thereby providing an indication of whether or not an attempt has been made to trip the solenoid normally included within the DUT 108 when the tester 100 is operating in the board test mode. As shown in FIG. 6b, the circuitry providing the solenoid status includes a header 612, resistors R23-27, a capacitor C13, a diode D9, and an Opto-coupler, which is operative to isolate this circuitry from the test controller 104. It is understood that the DUT 108 provides the reference signal Solenoid_Ref to the test circuitry 106 via the header 612. In effect, the circuitry of FIG. 6b operates to simulate a solenoid within the DUT 108, and to look for an attempted trip of the DUT board. In the presently disclosed embodiment, the resistor R27 is tapped into the DUT circuitry to simulate the solenoid.

Those of ordinary skill in this art will appreciate that, in general, simply turning the electronic switch T4 on and off will not simulate an electrical arcing condition, which is typically a random phenomenon. To simulate electrical arcing, the test controller 104 turns the switch T4 on momentarily via the control signal Switch_Ctnl at substantially random intervals of time. Such substantially random switching will generally appear as arcing to the DUT 108 at the AC power return $V_{AC}$_Ret. If the DUT 108 is operating properly, then the DUT 108 will respond to the arcing event in an appropriate manner, i.e., the solenoid within the DUT 108 will be tripped, thereby disconnecting the power input $V_{AC}$ from the device.

Figure 7A:
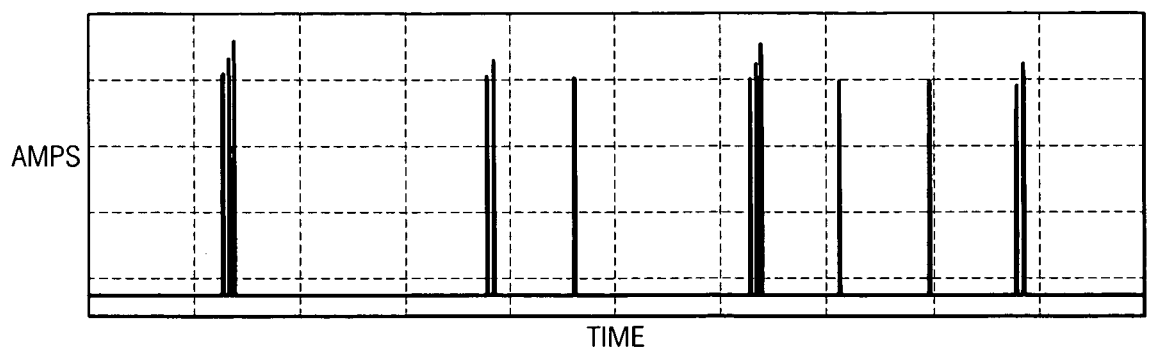
FIG. 7a is a timing diagram of simulated electrical arcing current generated using the test circuitry of FIG. 6a, as applied to an arc fault circuit interrupter device under test.
Figure 7B:
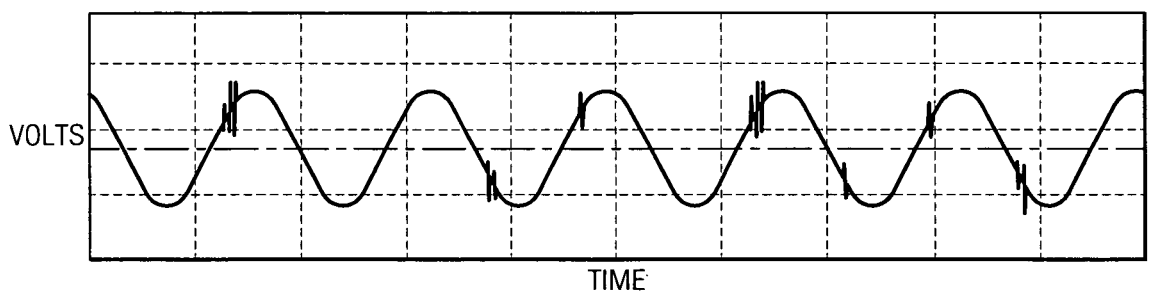
FIG. 7b is a timing diagram of simulated electrical arcing voltage corresponding to the simulated arcing current of FIG. 7a, as applied to an arc fault circuit interrupter device under test.

FIGS. 7a-7b depict diagrams of simulated electrical arcing current and voltage waveforms, respectively, as seen by the DUT 108 at the AC power return $V_{AC}$_Ret (see also FIG. 1). It is understood that the simulated arcing current and voltage waveforms of FIGS. 7a-7b are generated by the test circuitry 106 under the control of the test controller 104. Specifically, FIG. 7a depicts a plurality of current spikes, and FIG. 7b depicts a plurality of voltage spikes riding on a sinusoidal voltage waveform. As shown in FIGS. 7a-7b, the voltage spikes of FIG. 7b generally coincide with the current spikes of FIG. 7a, which occur at substantially random intervals.

To simulate a nuisance load, the test controller 104 turns the switch T4 on momentarily via the control signal Switch_Ctnl at substantially periodic intervals of time. Such substantially periodic switching will generally appear as a noisy or nuisance load to the DUT 108 at the AC power return $V_{AC}$_Ret. If the DUT 108 is operating properly, then the DUT 108 will respond to the nuisance load appropriately, i.e., the solenoid within the DUT 108 will not be tripped, and the power input $V_{AC}$ will therefore remain connected to the DUT 108.

Figure 8A:
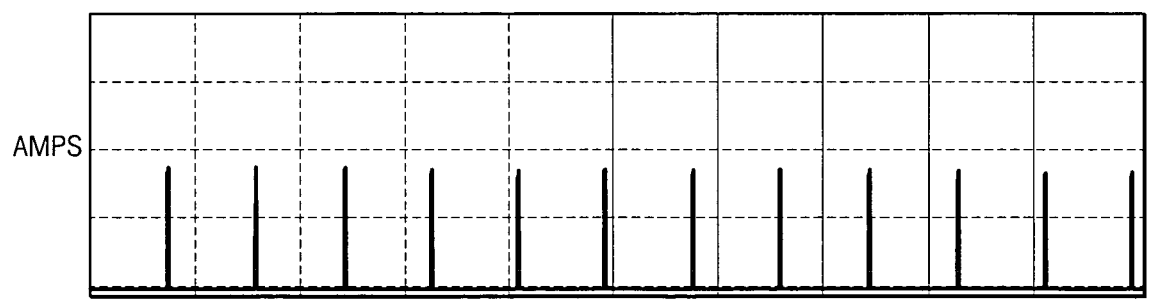
FIG. 8a is a timing diagram of a simulated nuisance load current generated using the test circuitry of FIG. 6a, as applied to an arc fault circuit interrupter device under test.
Figure 8B:
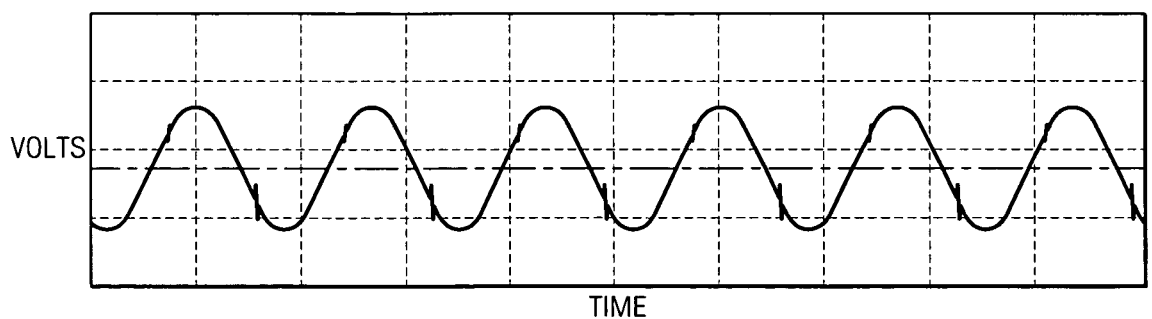
FIG. 8b is a timing diagram of a simulated nuisance load voltage corresponding to the simulated nuisance load current of FIG. 8a, as applied to an arc fault circuit interrupter device under test.

FIGS. 8a-8b depict diagrams of simulated nuisance load current and voltage waveforms, respectively; as seen by the DUT 108 at the AC power return $V_{AC}$_Ret (see also FIG. 1) It is understood that the simulated nuisance load current and voltage waveforms of FIGS. 8a-8b are generated by the test circuitry 106 under the control of the test controller 104. Specifically, FIG. 8a depicts a plurality of current spikes, and FIG. 8b depicts a plurality of voltage spikes riding on a sinusoidal voltage waveform. As shown in FIGS. 8a-8b, the voltage spikes of FIG. 8b generally coincide with the current spikes of FIG. 8a, which occur at substantially periodic intervals. For example, such a periodic noisy line condition can be generated by turning the switch T4 (see FIG. 6a) on momentarily once every AC half cycle. As described above, the test controller 104 can monitor the reference voltage Line_Ref to identify the points in the line voltage waveform at which to turn the switch on to generate the periodic noise depicted in FIGS. 8a-8b. It is noted that the current and voltage waveforms of FIGS. 8a-8b simulate a nuisance load condition that might be applied to an AFCI device powering a switch-mode power supply or a triac-fired lamp dimmer.

A method of operating the AFCI device tester 100 is described below with reference to FIGS. 1 and 9. As depicted in step 902, the test controller 104 causes the power supply 102 to apply AC power input $V_{AC}$ to the DUT 108 via the control signal Relay_Cntl. Next, suitable test control inputs Trip_Test and No_Trip_Test are applied to the test controller 104 by the operator to select either a first test mode for simulating/applying at least one arc fault to the AFCI device under test (DUT) 108 or a second test mode for simulating/applying a nuisance load to the DUT 108, as depicted in step 904. As described above, the test control inputs Trip_Test and No_Trip_Test can be applied by the operator via switch inputs or via the RS232 serial interface 306 (see FIG. 3b). In the event the first test mode is selected, the test controller 104 turns the switch T4 (see FIG. 6a) on momentarily at substantially random intervals via the control signal Switch_Cntl to simulate and apply at least one arc fault to the DUT 108, as depicted in step 906. In the event the second test mode is selected, the test controller 104 turns the switch T4 (see FIG. 6a) on momentarily at substantially periodic intervals via the control signal Switch_Cntl to simulate and apply a nuisance load to the DUT 108, as depicted in step 908. The test controller 104 then monitors the digital reference signal DUT_Ref to determine whether the solenoid within the DUT 108 has been tripped in response to the arc fault, or has not been tripped in response to the nuisance load, thereby determining whether the DUT 108 is operating properly, as depicted in step 910. In the event the DUT 108 is operating properly, the test controller 104 provides an indication that the DUT 108 has passed the test via the digital outputs DO_0, DO_1, as depicted in step 912. Otherwise, the test controller 104 employs the digital outputs DO_0, DO_1 to indicate that the DUT 108 has failed the test, as depicted in step 914. As described above, the digital outputs DO_0, DO_1 may be employed to drive respective LEDs.

It should be understood that the method of tester operation depicted in FIG. 9 is provided for purposes of illustration only, and that any other suitable method of operating the tester 100 may be employed. For example, many different types of load conditions may be simulated and applied to the DUT 108 by the tester 100 in addition to the load conditions depicted in FIGS. 7a-7b and 8a-8b. Further, using the intelligent control capabilities of the micro-controller 304 (see FIG. 3a), one or more load conditions may be simulated and applied to the DUT 108 during a single test cycle.

In addition to the first and second test modes performed in the method of operation depicted in FIG. 9, the tester 100 may be operated in the final device assembly test mode and the board test mode via a suitable jumper arrangement within the test mode selection circuitry 310 (see FIG. 3c). For example, when operating in the final device assembly test mode, the tester 100 may test an AFCI device such as the DUT 108, and provide an indication of whether the device passed or failed the test via the digital outputs DO_0, DO_1. As described above, the tester 100 can determine whether or not the device responded as expected to an applied arc fault or nuisance load by monitoring the digital reference signal DUT_Ref provided by the test circuitry 106 (see FIG. 1). When operating in the board test mode, the tester 100 can determine whether or not the DUT 108 responded as expected to applied arc faults or nuisance loads by monitoring the status signal Solenoid_Status.

Having described the above illustrative embodiments, other alternative embodiments or variations may be made. For example, the AFCI device tester 100 of FIG. 1 may be configured for use in a variety of AFCI testing applications including, but not limited to, the testing of an AC AFCI device (e.g., 60 Hz, 400 Hz, 120 $V_{AC}$, 240 $V_{AC}$, etc.), the testing of a DC AFCI device (e.g., 28 $V_{DC}$, 270 $V_{DC}$, etc.), production testing on an assembly line, quality assurance inspecting, and quality and reliability testing of an AFCI device.

Figure 10:
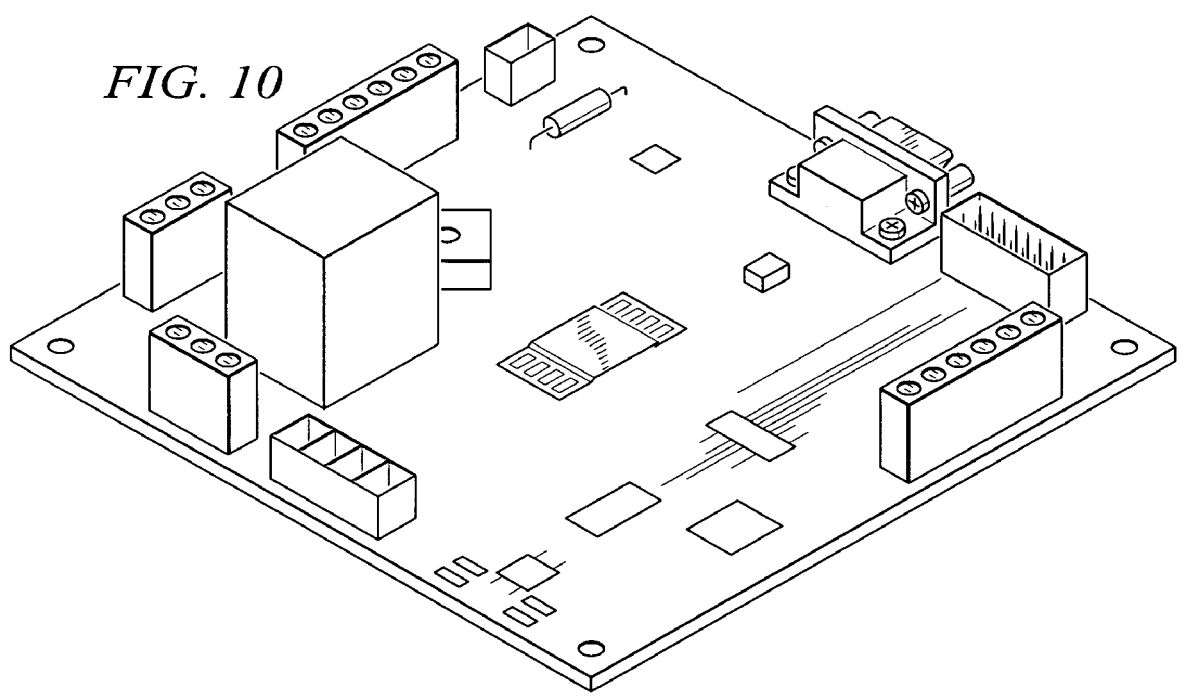
FIG. 10 is a plan view of a printed circuit board assembly of the tester of FIG. 1.

In addition, the tester 100 may be incorporated into a portable or hand-held AFCI test device or test box. To that end, the tester 100 may be implemented on a printed circuit board, as depicted in FIG. 10, and housed in a suitable portable or hand-held enclosure (not shown).

In addition, it is appreciated that the functions necessary to implement the tester 100 may be embodied in whole or in part using hardware or software or some combination thereof using digital signal processors, micro-controllers, microprocessors, programmable logic arrays, or any other suitable hardware and/or software.

It will further be appreciated by those of ordinary skill in the art that further modifications to and variations of the above-described arc fault circuit interrupter test circuit and test board may be made without departing from the inventive concepts disclosed herein. Accordingly, the invention should not be viewed as limited except as by the scope and spirit of the appended claims.

What is claimed is:

1. A tester for an arc fault circuit interrupter (AFCI), the AFCI being connectable between hot and neutral conductors of an AC power line, the tester comprising:
   a first full wave bridge rectifier having first and second inputs and an output, the first and second inputs being connectable to the hot and neutral conductors, respectively, of the AC power line;
   a resistive load and a switch connected in series between the first bridge rectifier output and ground; and
   a controller operative in first and second modes to provide at least one switch control pulse for turning the switch on to generate current in the AC power line,
   wherein the controller is operative in the first mode to provide a first plurality of switch control pulses for generating simulated arc fault current in the AC power line, and further operative in the second mode to provide a second plurality of switch control pulses for generating simulated noise current in the AC power line,
   whereby the tester is operative in the first and second modes of the controller to determine proper operation of the AFCI under arcing and nuisance load conditions, respectively.

2. The tester of claim 1 wherein the controller is operative in the first mode to provide the first plurality of switch control pulses for turning the switch on momentarily at substantially random intervals of time, thereby generating the simulated arc fault current in the AC power line.

3. The tester of claim 1 wherein the controller is operative in the second mode to provide the second plurality of switch control pulses for turning the switch on momentarily at substantially periodic intervals of time, thereby generating the simulated noise current in the AC power line.

4. The tester of claim 3 wherein the controller is further operative to monitor a plurality of AC power cycles, and wherein the substantially periodic intervals at which the switch is turned on momentarily correspond to predetermined points within successive AC cycles.

5. The tester of claim 4 wherein the predetermined points within successive AC cycles correspond to respective points within successive AC half cycles.

6. The tester of claim 1 further comprising power supply circuitry including a second full wave bridge rectifier having first and second inputs and an output, the first and second inputs of the second bridge rectifier being connectable to the hot and neutral conductors, respectively, of the AC power line, the output of the second bridge rectifier being connected to the voltage regulator, wherein the voltage regulator is operative to receive a rectified AC voltage, and to generate a regulated DC supply voltage.

7. The tester of claim 6 wherein at least the controller is powered by the DC supply voltage.

8. The tester of claim 6 wherein the power supply circuitry further includes a relay circuit having an input and an output, the input of the relay circuit being coupleable to the AC power line, the output of the relay circuit being coupleable to the AFCI, and wherein the controller is further operative to provide relay control pulses for activating the relay circuit, thereby providing relay-controlled AC power input to the AFCI.

9. The tester of claim 1 further including circuitry configured to monitor a status of an electromechanical interface within the AFCI, the electromechanical interface being operative to disconnect AC power input from the AFCI, the electromechanical interface status being indicative of whether the electromechanical interface has disconnected the AC power input from the AFCI in response to the simulated arc fault current, thereby indicating proper operation of the AFCI under the arcing condition.

10. The tester of claim 9 wherein the electromechanical interface status is further indicative of whether the electromechanical interface has maintained a connection from the AC power input to the AFCI in response to the simulated noise current, thereby indicating proper operation of the AFCI under the nuisance load condition.

11. A method of testing an arc fault circuit interrupter (AFCI), the AFCI being connectable to a power line, comprising the steps of:
selecting between first and second modes of testing the AFCI,
wherein the first mode is for use in verifying proper operation of the AFCI under an arcing condition, and the second mode is for use in verifying proper operation of the AFCI under a nuisance load condition;
in the event the first mode is selected, generating simulated arc fault current in the power line;
in the event the second mode is selected, generating simulated noise current in the power line;
determining a response of the AFCI to the simulated arc fault current or the simulated noise current; and
providing an indication of the AFCI response.

12. The method of claim 11 wherein the step of generating simulated arc fault current includes generating a plurality of simulated arcing current events.

13. The method of claim 12 wherein the respective simulated arcing current events are generated in succession at substantially random intervals of time.

14. The method of claim 11 wherein the step of generating simulated noise current includes generating a plurality of simulated noise current events.

15. The method of claim 14 wherein the respective simulated noise current events are generated in succession at substantially periodic intervals of time.

16. The method of claim 11 wherein the step of determining the response of the AFCI to the simulated arc fault current includes determining whether the AFCI is disconnected from the power line.

17. The method of claim 11 wherein the step of determining the response of the AFCI to the simulated noise current includes determining whether the AFCI maintained a connection to the power line.

18. The method of claim 11 wherein the providing step includes providing a visual indication of the AFCI response to a human operator.

19. The method of claim 11 further including the step of selecting between third and fourth modes of testing the AFCI, wherein the third mode is for use in verifying proper operation of an AFCI device assembly, and the fourth mode is for use in verifying proper operation of at least one AFCI board assembly.

20. The method of claim 19 wherein the determining step includes determining a status of an electromechanical interface within at least one AFCI, the electromechanical interface being operative to disconnect the AFCI from the power line, and wherein the priding step includes, in the event the fourth mode is selected, providing an indication of the AFCI response based on the status of the electromechanical interface of the at least one AFCI.

* * * * *